United States Patent [19]

McLaughlin et al.

[11] Patent Number: 4,779,230
[45] Date of Patent: Oct. 18, 1988

[54] CMOS STATIC RAM CELL PROVIDED WITH AN ADDITIONAL BIPOLAR DRIVE TRANSISTOR

[75] Inventors: Kevin L. McLaughlin, Chandler; Walter C. Seelbach, Fountain Hills, both of Ariz.

[73] Assignee: Motorola, Inc., Schaumburg, Ill.

[21] Appl. No.: 947,124

[22] Filed: Dec. 29, 1986

[51] Int. Cl.⁴ .............................................. G11C 7/00
[52] U.S. Cl. .................................. 365/156; 365/177; 365/190
[58] Field of Search ............... 365/177, 190, 154, 156; 357/43

[56] References Cited

U.S. PATENT DOCUMENTS 3,553,541 4/1969 King ..................................... 365/177
4,701,883 10/1987 Wrathall et al. ..................... 365/156

FOREIGN PATENT DOCUMENTS 0136095 7/1985 Japan .................................... 365/177

Primary Examiner—Stuart N. Hecker
Assistant Examiner—Glenn A. Gossage
Attorney, Agent, or Firm—Michael D. Bingham

[57] ABSTRACT

A BIMOS memory cell is formed by providing a CMOS static RAM cell with an additional NPN bipolar transistor to provide additional drive current during the read cycle to improve the read time of the memory cell.

14 Claims, 1 Drawing Sheet

CMOS STATIC RAM CELL PROVIDED WITH AN ADDITIONAL BIPOLAR DRIVE TRANSISTOR

BACKGROUND OF THE INVENTION

The present invention relates in general to the field of memories. More particularly, the present invention relates to a BIMOS memory cell having improved read speed as a result of having a separate NPN transistor to provide additional drive for the read cycle.

The basic CMOS cross coupled latch, which is well known in the art, forms a basic static storage element. In such a device both the reading and writing of the cell have in the past been accomplished by a bit line coupled directly to the cell. This bit line is ordinarily coupled to a number of separate cells and therefore represents a fairly high capacitive load. The read time would therefore be relatively long in that the memory cell itself would be relied upon to transfer current to the high capacitive load bit line. The CMOS memory cell does not ordinarily provide a high current which could charge the capacitive load of the bit line rapidly. The read times have therefore been relatively high for those devices which couple the bit line directly to the CMOS cross coupled latch memory cell.

SUMMARY OF THE INVENTION

It is therefore an object of the present invention to provide a BIMOS memory cell having improved read cycle times. It is further an object of the present invention to provide an improved BIMOS memory cell having an additional bipolar transistor to provide additional drive current.

It is still further an object of the present invention to provide an improved BIMOS memory cell with faster read times and a relatively small increase in size.

A still further object of the present invention is to provide an improved BIMOS memory cell with no additional wires required outside the cell.

The foregoing and other objects are achieved in the present invention wherein there is proiided an improved BIMOS memory cell having a reduced read cycle time. The cell comprises first, second, third and fourth transistors, each having a control terminal and first and second load terminals. The first load terminals of the first and second transistors are coupled together for coupling to a first word line terminal. The first load terminals of the third and fourth transistors are coupled together for coupling to a second word line terminal. The second load terminals of the first and third transistors are coupled to the control terminals of the second and fourth transistors. The second load terminals of the second and fourth transistors are coupled to the control terminal of the first and third transistors and to the base terminal of a fifth transistor having emitter, base and collector terminals. The collector terminal of the fifth transistor is coupled to the first word line terminal and the emitter of the fifth transistor is coupled to a first bit line. The first load terminal of a sixth transistor, having first and second load terminals and a control terminal, is coupled to the second load terminal of the second transistor and the second load terminal of the sixth transistor is coupled to the first bit line. The base terminal of a seventh transistor is coupled to the second load terminal of th first transistor and to the first load terminal of an eighth transistor, the second load terminal of which is coupled to a complemented first bit line. The collector of the seventh transistor is coupled to the first word line terminal and the emitter is coupled to the complemented first bit line. The control terminals of the sixth and eighth transistors are coupled to a write enable terminal. In operation the fifth and seventh transistors provide increased current drive to the first bit line and complemented first bit line, respectively.

BRIEF DESCRIPTION OF THE DRAWINGS

The above-mentioned and other features and objects of the present invention and the manner of attaining them will become more apparent and the invention itself will be best understood by reference to the following description of an embodiment of the invention taken in conjunction with the accompanying drawings, wherein.

DESCRIPTION OF A PREFERRED EMBODIMENT

Figure 1:
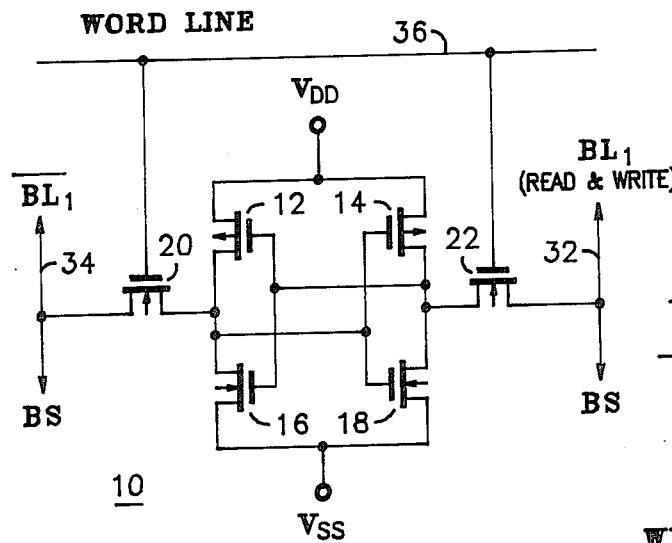
FIG. 1 is schematic diagram of a conventional CMOS memory cell.

With reference to FIG. 1 there is shown a CMOS cross coupled latch which forms the basic static storage element for a memory device. The memory cell itself comprises CMOS transistors 12, 14, 16 and 18. In operation the cell is normally in one of two stable states with either the gates of transistors 12 and 16 at a logic high and the gates of transistors 14 and 18 at a logic low or vice-versa. This prior art memory cell is both read and written via bit lines 32 and 34. During either a read or write cycle a voltage is applied to word line 36 thereby turning on transistors 20 and 22 and coupling the cell to bit lines 32 and 34. The true output is read on bit line 32 and the complemented output is read on bit line 34. Since bit line 32 is a relatively long conductor which is coupled to many other cells it represents a relatively high capacitance and therefore a relatively long time is required for the CMOS cell itself to charge this capacitance and transfer the logic signal or voltage corresponding thereto to bit line 32.

While there are other prior art methods of coupling the bit line to a CMOS memory cell, virtually all of them require the memory cell itself to charge the relatively high capacitance of the single bit line. During the write cycle a voltage is applied to word line 36 again turning on transistors 20 and 22. The logic information contained on bit lines 32 and 34 is then transferred to the memory cell itself via transistors 20 and 22.

Figure 2:
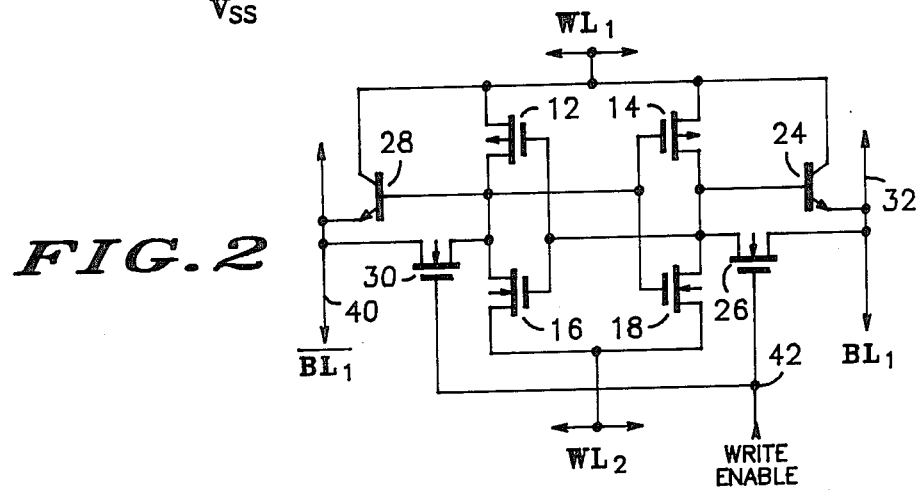
FIG. 2 is a schematic diagram of a BIMOS memory cell in accordance with the present invention including the additional drive transistors.

Referring now to FIG. 2. there is shown a BIMOS memory cell with additional bipolar transistors 24 and 28. CMOS transistors 12, 14, 16 and 18 are coupled as in a standard cross coupled latch. The source terminals of transistors 12 and 14 are coupled together for coupling to a first word line terminal. The gate terminals of transistors 12 and 16 are coupled together and to the drain terminals of transistors 14 and 18. The gate terminals of 14 and 18 are coupled together and to the drain terminals of transistors 12 and 16. The source terminals of transistors 16 and 18 are coupled together for coupling to a second word line terminal. The base terminal of transistor 24 is coupled to the drain terminal of transistor 14. The base terminal of transistor 24 and the drain terminal of transistor 14 may be merged into the same diffusion area. The collector terminal of transistor 24 is coupled to the first word line terminal and the emitter terminal of transistor 24 is coupled to a first bit line 32. The first load terminal of transistor 26 is coupled to the drain terminal of transistor 14 and the second load terminal of transistor 26 is coupled to first bit line 32. The base terminal of transistor 28 is coupled to the drain terminal of transistor 12 and to the first load terminal of transistor 30, the second load terminal of which is coupled to a complemented first bit line 40. The base terminal of transistor 28 and the drain terminal of transistor 12 may be merged into the same diffusion area. The collector of transistor 28 is coupled to the first word line terminal and the emitter of transistor 28 is coupled to the complemented first bit line 40. The control terminals of transistors 26 and 30 are coupled to a write enable terminal 42.

The basic memory cell comprising transistors 12, 14, 16 and 18, as with the prior art memory cell, will be in one of two steady state latched conditions with either the gates of transistors 12 and 16 at a high logic state and the gates of transistors 14 and 18 in a low logic state or vice-versa. During the read cycle, however, a large drive current is provided through transistor 24 to charge the capacitance of bit line 32. Since the charge current being supplied by transistor 24 is approximately beta times the base current being supplied directly from the memory cell, the charge time would be reduced by approximately a factor of beta, substantially reducing the read time of the memory cell.

During static conditions word line one is at a voltage level above word line two, for example approximately two volts. During address word lines one and two are both driven approximately 1.6 volts higher, which causes the emitter follower to turn on thereby raising the bit line to the word line voltage minus the drop across the emitter follower, or 3.6−0.8=2.8 volts, which can easily be sensed by a bipolar sense amp.

The write cycle is accomplished by addressing the cell as above, then applying a write enable signal to write enable terminal 42 thereby turning on gates 26 and 30. Bit lines 32 and 40 are then driven high or low as required to set the latch to the desired state. The write enable signal is then removed from terminal 42 and the cell will remain in a given condition until another write cycle is accomplished.

Figure 3:
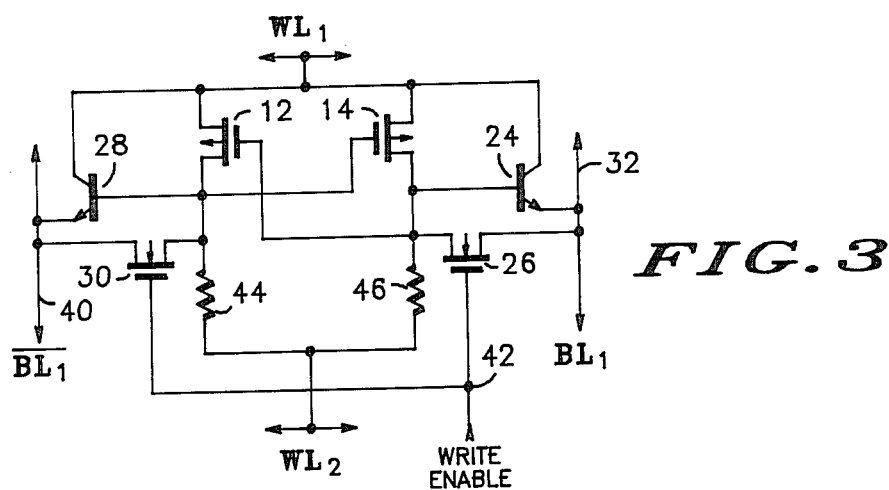
FIG. 3 is a schematic diagram of a BIMOS memory cell in accordance with an alternative embodiment of the present invention.

An alternative embodiment is shown in FIG. 3 wherein transistors 16 and 18 of the basic memory cell have been replaced by resistors 44 and 46 respectively. The basic cell operation as well as the increased drive current supplied by transistors 24 and 28 would be as described above but the elimination of two transistors would result in a physically smaller cell.

What has been provided therefore is a memory cell configuration which gives substantially ECL speed on the read cycle while keeping the standby power in the array to that of a CMOS memory. In addition, the memory cell of the present invention would be compatible with ECL sense amplifiers.

While the present invention has been described above in conjunction with specific apparatus, it is to be clearly understood that this description is made only by way of example and not as a limitation to the scope of the invention.

We claim:

1. A memory cell comprising: first, second, third and fourth transistors each having a control terminal and first and second load terminals, said first load terminal of said first and second transistors coupled together for connection to a first word line terminal, said first load terminals of said third and fourth transistors coupled together for connection to a second word line terminal;

a fifth transistor having a control terminal and first and second load terminals, said first load terminal of said fifth transistor coupled to said first word line terminal, said control terminal of said fifth transistor coupled to said second load terminals of said second and fourth transistors and s aid second load terminal of said fifth transistor for coupling to a first bit line;

a sixth transistor having a control terminal and first and second load terminals, said first load terminal of said sixth transistor coupled to the control terminals of said first, third and fifth transistors and said second load terminal of said sixth transistor coupled to said second load terminal of said fifth transistor;

a seventh transistor having a control terminal and first and second load terminals, said first load terminal of said seventh transistor coupled to said first word line terminal, said control terminal of said seventh transistor coupled to said second load terminals of said first and third transistors and said second load terminal of said seventh transistor coupled to a complemented first bit line;

an eighth transistor having a control terminal and first and second load terminals, said first load terminal of said eighth transistor coupled to the control terminals of said second, fourth and seventh transistors, said second load terminal of said eighth transistor coupled to said second load terminal of said seventh transistor and said control terminals of said sixth and eighth transistors for coupling to a write enable terminal; and wherein said first, second, third, fourth, sixth and eighth transistors are field effect transistors and said fifth and seventh transistors are bipolar transistors.

2. The memory cell of claim 1 wherein said first and second transistors are p-channel transistors and said third, fourth, sixth and eighth transistors are n-channel transistors.

3. The memory cell of claim 2 wherein said fifth and seventh transistors are NPN transistors.

4. The memory cell of claim 2 wherein said control terminals of said first, second, third and fourth transistors are gate terminals and said first and second load terminals of said first, second, third and fourth transistors are source and drain terminals, respectively.

5. The memory cell of claim 2 wherein said first, second, third, fourth, fifth, sixth, seventh and eighth transistors are contained in an integrated circuit.

6. The memory cell of claim 5 wherein said fifth and seventh transistors are respectively merged with the second load terminals of said second and first transistors.

7. In a memory cell comprising: first, second third and fourth transistors, each having a control terminal and first and second load terminals, said first load terminals of said first and second transistors coupled together for connection to a first word line terminal, said first load terminals of said third and fourth transistors coupled together for connection to a second word line terminal, said control terminals of said first and third transistors coupled together and coupled to said second load terminals of said second and fourth transistors for coupling to a first bit line, and said control terminals of said second and fourth transistors coupled together and to said second load terminals of said first and third transistors for coupling to a complemented first bit line, the improvement comprising:
- a fifth transistor having a control terminal and first and second load terminals, said first load terminal of said fifth transistor coupled to said first word line terminal, said control terminal of said fifth transistor coupled to said second load terminals of said second and fourth transistors and said second load terminal of said fifth transistor for coupling to a first bit line;
- a sixth transistor having a control terminal and first and second load terminals, said first load terminal of said sixth transistor coupled to the control terminals of said first, third and fifth transistors and said second load terminal of said sixth transistor coupled to said second load terminal of said fifth transistor;
- a seventh transistor having a control terminal and first and second load terminals, said first load terminal of said seventh transistor coupled to said first word line terminal, said control terminal of said seventh transistor coupled to said second load terminals of said first and third transistors and said second load terminal of said seventh transistor coupled to a complemented first bit line;
- an eighth transistor having a control terminal and first and second load terminals, said first load terminal of said eighth transistor coupled to the control terminals of said second, fourth and seventh transistors, said second load terminal of said eighth transistor coupled to said second load terminal of said seventh transistor and said control terminals of said control terminals of said sixth and eighth transistors for coupling to a write enable terminal; and wherein said first, second third, fourth sixth and eighth transistors are field effect transistors and said fifth and seventh transistors are bipolar transistors.

8. The memory cell of claim 7 wherein said first and second transistors are p-channel transistors and said third, fourth, sixth and eighth transistors are n-channel transistors.

9. The memory cell of claim 8 wherein said first, second, third, fourth, fifth, sixth, seventh and eighth transistors are contained in an integrated circuit.

10. The circuit of claim 9 wherein said first and seventh transistors are respectively merged into the second load terminals of said second and first transistors.

11. A memory cell comprising: first and second resistors and first and second transistors, each of said transistors having a control terminal and first and second load terminals, said first load terminals of said first and second transistors coupled together for connection to a first word line terminal and said second load terminals of said first and second transistors respectively coupled to one end of said first and second resistors, the other ends of said first and second resistors coupled to a second word line terminal;
- a third transistor having a control terminal and first and second load terminals, said first load terminal of said third transistor coupled to said first word line terminal and said second load terminal of said third transistor for coupling to a first bit line;
- a fourth transistor having a control terminal and first and second load terminals, said first load terminal of said fourth transistor coupled to the control terminals of said first and third transistors and said second load terminal of said fourth transistor coupled to said second load terminal of said third transistor;
- a fifth transistor having a control terminal and first and second load terminals, said first load terminal of said fifth transistor coupled to said first word line terminal and said second load terminal of said fifth transistor coupled to a complemented first bit line;
- a sixth transistor having a control terminal and first and second load terminals, said first load terminal of said sixth transistor coupled to the control terminals of said second and fifth transistors, said second load terminal of said sixth transistor coupled to said second load terminal of said fifth transistor and said control terminals of said fourth and sixth transistors for coupling to a write enable terminal; and wherein said first, second, fourth and sixth transistors are field effect transistors and said third and fifth transistors are bipolar transistors.

12. The memory cell of claim 11 wherein said first and second transistors are p-channel transistors and said fourth and sixth transistors are n-channel transistors.

13. The memory cell of claim 12 wherein said first, second, third, fourth, fifth and sixth transistors are contained in an integrated circuit.

14. The circuit of claim 13 wherein said third and fifth transistors are respectively merged into the second load terminals of said second and first transistors.

* * * * *

UNITED STATES PATENT AND TRADEMARK OFFICE
CERTIFICATE OF CORRECTION

PATENT NO. : 4,779,230

DATED : October 18, 1988

INVENTOR(S) : Kevin L. McLaughlin

It is certified that error appears in the above-identified patent and that said Letters Patent is hereby corrected as shown below:

Column 4, claim 1, line 01, following "said first load", please delete "terminal" and insert therefor --terminals--.

Column 4, claim 1, line 12, please delete "s aid" insert therefor --said--.

Column 5, claim 7, line 40, please delete "said control terminals of".

Signed and Sealed this

Twenty-sixth Day of December, 1989

Attest:

JEFFREY M. SAMUELS

Attesting Officer   Acting Commissioner of Patents and Trademarks